(12) United States Patent
Masatsugu et al.

(10) Patent No.: US 9,491,861 B2
(45) Date of Patent: Nov. 8, 2016

(54) WIRING SUBSTRATE AND SUBSTRATE MODULE

(71) Applicant: TOYODA GOSEI CO., LTD., Kiyosu-shi (JP)

(72) Inventors: Yoshinori Masatsugu, Kiyosu (JP); Hideaki Kato, Kiyosu (JP); Tomohiro Miwa, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 49 days.

(21) Appl. No.: 14/332,246

(22) Filed: Jul. 15, 2014

(65) Prior Publication Data

US 2015/0028380 A1    Jan. 29, 2015

(30) Foreign Application Priority Data

Jul. 24, 2013  (JP) .................................. 2013-153235

(51) Int. Cl.
| | |
|---|---|
| *H01R 12/53* | (2011.01) |
| *H05K 1/11* | (2006.01) |
| *H05K 1/18* | (2006.01) |
| *H01R 12/70* | (2011.01) |
| *H01R 12/71* | (2011.01) |
| *H01R 12/75* | (2011.01) |

(52) U.S. Cl.
CPC ............. *H05K 1/119* (2013.01); *H01R 12/53* (2013.01); *H01R 12/707* (2013.01); *H01R 12/716* (2013.01); *H01R 12/75* (2013.01); *H05K 1/181* (2013.01); *H05K 2201/10189* (2013.01)

(58) Field of Classification Search
None
See application file for complete search history.

(56) References Cited

U.S. PATENT DOCUMENTS

| | | | |
|---|---|---|---|
| 7,871,286 B2 | 1/2011 | Motohira et al. | |
| 2005/0025435 A1* | 2/2005 | Miyamae | ........................ 385/88 |
| 2012/0026669 A1* | 2/2012 | Fan et al. | ................. 361/679.31 |

FOREIGN PATENT DOCUMENTS

| | | |
|---|---|---|
| JP | H04-180289 A | 6/1992 |
| JP | 2009-76239 A | 4/2009 |
| JP | 2012-015226 | 1/2012 |
| JP | 2012-031402 A | 2/2012 |
| JP | 2012-243462 A | 12/2012 |

OTHER PUBLICATIONS

Japanese Office Action dated Jun. 14, 2016 with a partial English translation.

* cited by examiner

*Primary Examiner* — Fernando L Toledo
*Assistant Examiner* — Valerie N Newton
(74) *Attorney, Agent, or Firm* — McGinn IP Law Group, PLLC

(57) ABSTRACT

A wiring substrate includes a wiring pattern that is formed on a surface of a conductive board via an insulation layer and an extension part that is extended from the wiring pattern. The extension part is disposed in a portion located immediately below a detachable connector. The detachable connector is connected to a fixed connector mounted on the wiring substrate and connected and fixed to the wiring pattern.

5 Claims, 3 Drawing Sheets

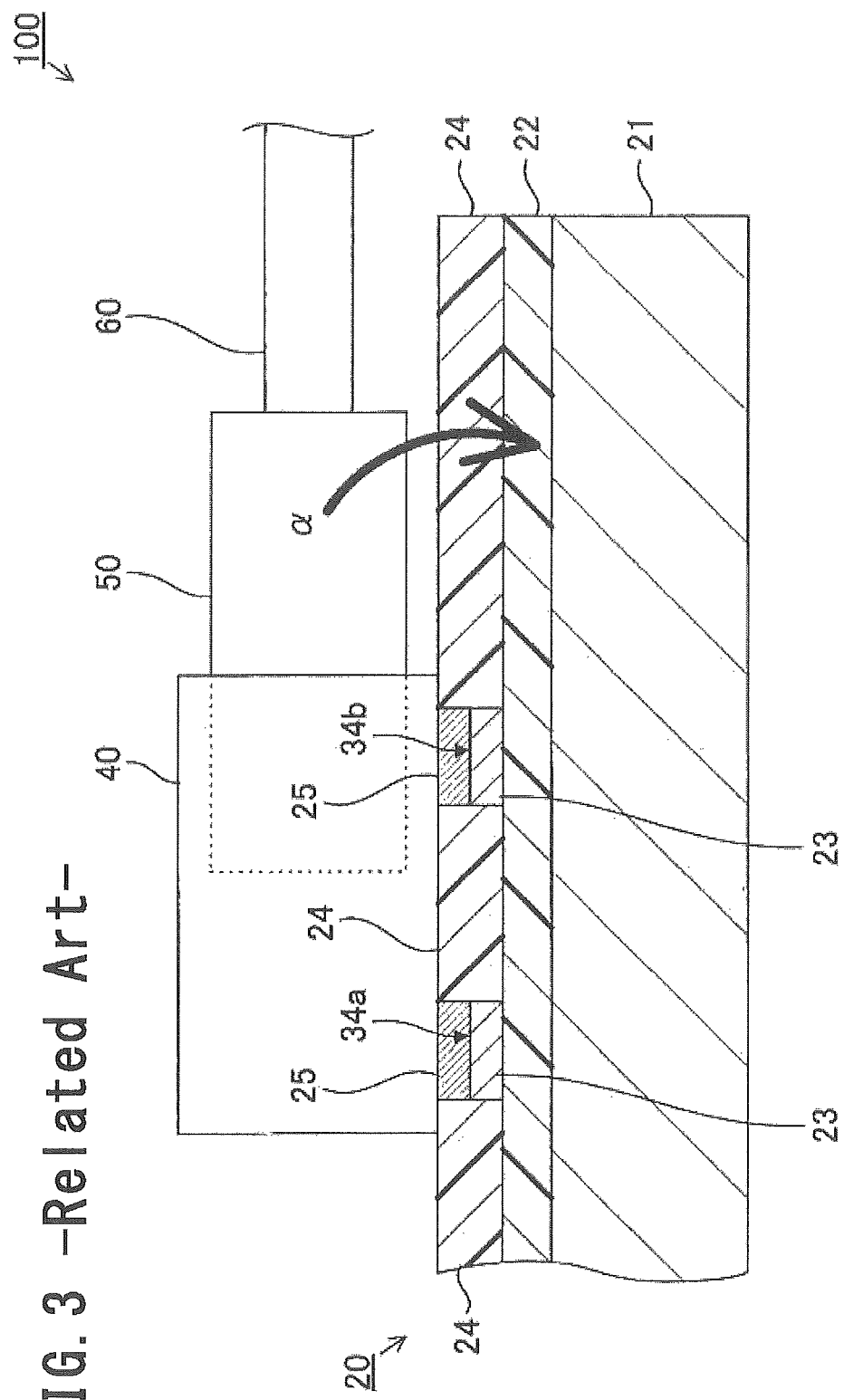
FIG. 3 —Related Art—

WIRING SUBSTRATE AND SUBSTRATE MODULE

CROSS-REFERENCE TO RELATED APPLICATION

This application is based on Japanese Patent Application No. 2013-153235 filed on Jul. 24, 2013, the contents of which are incorporated herein by reference.

BACKGROUND OF THE INVENTION

1. Technical Field

The present invention relates to a wiring substrate and a substrate module and, more particularly, to a wiring substrate having a conductive substrate and a substrate module having the wiring substrate.

2. Background Art

The background art of JP-A-2009-076239 discloses a technique that a board having elements mounted thereon is connected by a flat cable equipped with a connector for an electric wire.

JP-A-2012-015226 discloses an invention that includes a board having at least an insulative surface, a wiring pattern having a power supply conductor layer and a power supply terminal layer, which are formed on the surface of the board and a light emitting element electrically connected to the wiring pattern and mounted on the board and that an electrical connecting means (pressure-contact type power supply connector) is connected to the power supply terminal layer by an elastic contact pressure. Conventionally, a substrate module has been used that includes a wiring substrate having a wiring pattern which is formed on a surface of a conductive board via an insulation layer, and a fixed connector and circuit elements, which are mounted/carried on the wiring substrate and soldered to the wiring pattern.

When the substrate module is assembled to an electronic product, it is possible to facilitate the assembly of the electronic product by connecting the detachable connector to the fixed connector and connecting the connecting cable extended from the detachable connector to other electronic devices within the electronic product.

However, the substrate module as described above has a problem that the insulation failure occurs in the conductive board and therefore the short-circuit failure between the conductive board and each of the detachable connector and the fixed connector is caused when, for some reasons, load is applied to the detachable connector to cause the detachable connector to be tilted, a portion of the detachable connector peels off and protrudes through the insulation layer and thus the portion of the detachable connector comes into contact with a surface of the conductive board.

The present invention has been made to solve the above problems and has the following objects.

(1) There is provided a wiring substrate which is capable of preventing the occurrence of the insulation failure and does not cause the short-circuit failure with the connector mounted.

(2) There is provided a substrate module which includes the wiring substrate of the configuration (1).

The present inventors have studied to solve the above problems and, as a result, have conceived each aspect of the present invention as described below.

SUMMARY

<First Aspect>

Accordingly, in the first aspect, the detachable connector is fixed in a state of being abutted against the extension part of the wiring pattern extended at a position immediately below the detachable connector even when, for some reasons, load is applied to the detachable connector to cause the detachable connector to be tilted. As a result, the detachable connector is not tilted more than that.

Accordingly, there is no possibility that a portion of the detachable connector peels off and protrudes through the insulation layer and the detachable connector comes into contact with the surface of the conductive board. Therefore, the insulation failure can be prevented from occurring in the conductive board. As a result, it is possible to prevent the short-circuit failure from occurring between the conductive board and each of the detachable connector and the fixed connector.

<Second Aspect>

Accordingly, in the second aspect, the detachable connector is fixed in a state of being abutted against the extension part of the wiring pattern even when the detachable connector is tilted and a portion of the detachable connector peels off and protrudes through the covering layer. As a result, it is possible to obtain the same operation/effect as the first aspect.

<Third Aspect>

Accordingly, in the third aspect, the wiring pattern and the fixed connector can be connected and fixed to each other with low cost.

<Fourth Aspect>

Accordingly, according to the fourth aspect, it is possible to provide a light emitting substrate module that is capable of achieving the same operation/effect as the first to third aspects.

<Fifth Aspect>

Accordingly, according to the fifth aspect, radiation of light from the light emitting area is not hindered by the fixed connector and the detachable connector and therefore it is possible to provide the light emitting substrate module with high luminous efficiency.

BRIEF DESCRIPTION OF THE DRAWINGS

FIG. 3 is a longitudinal sectional view showing a schematic configuration of an LED substrate module 100 according to the related art.

DESCRIPTION OF PREFERRED EMBODIMENT

Figure 1A:
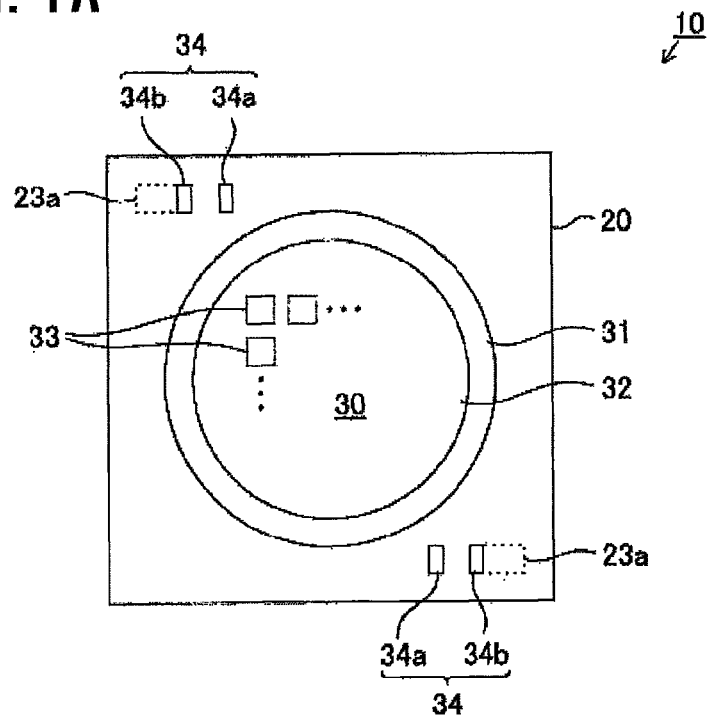
FIG. 1A is a plan view of an LED substrate module 10 of an illustrative embodiment embodying the present invention and FIG. 1B is a plan view showing a state where each of connectors 40, 50 is mounted on the LED substrate module 10.
Figure 1B:
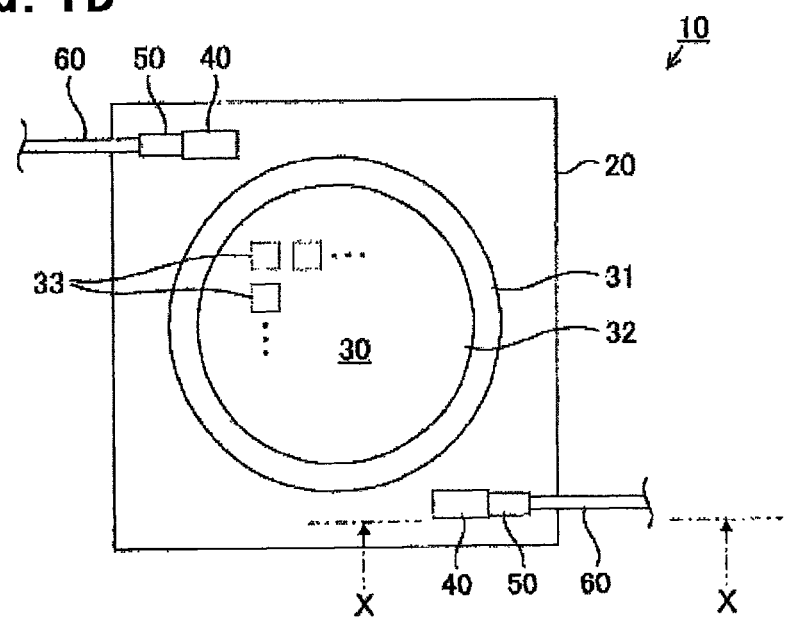
Figure 2:
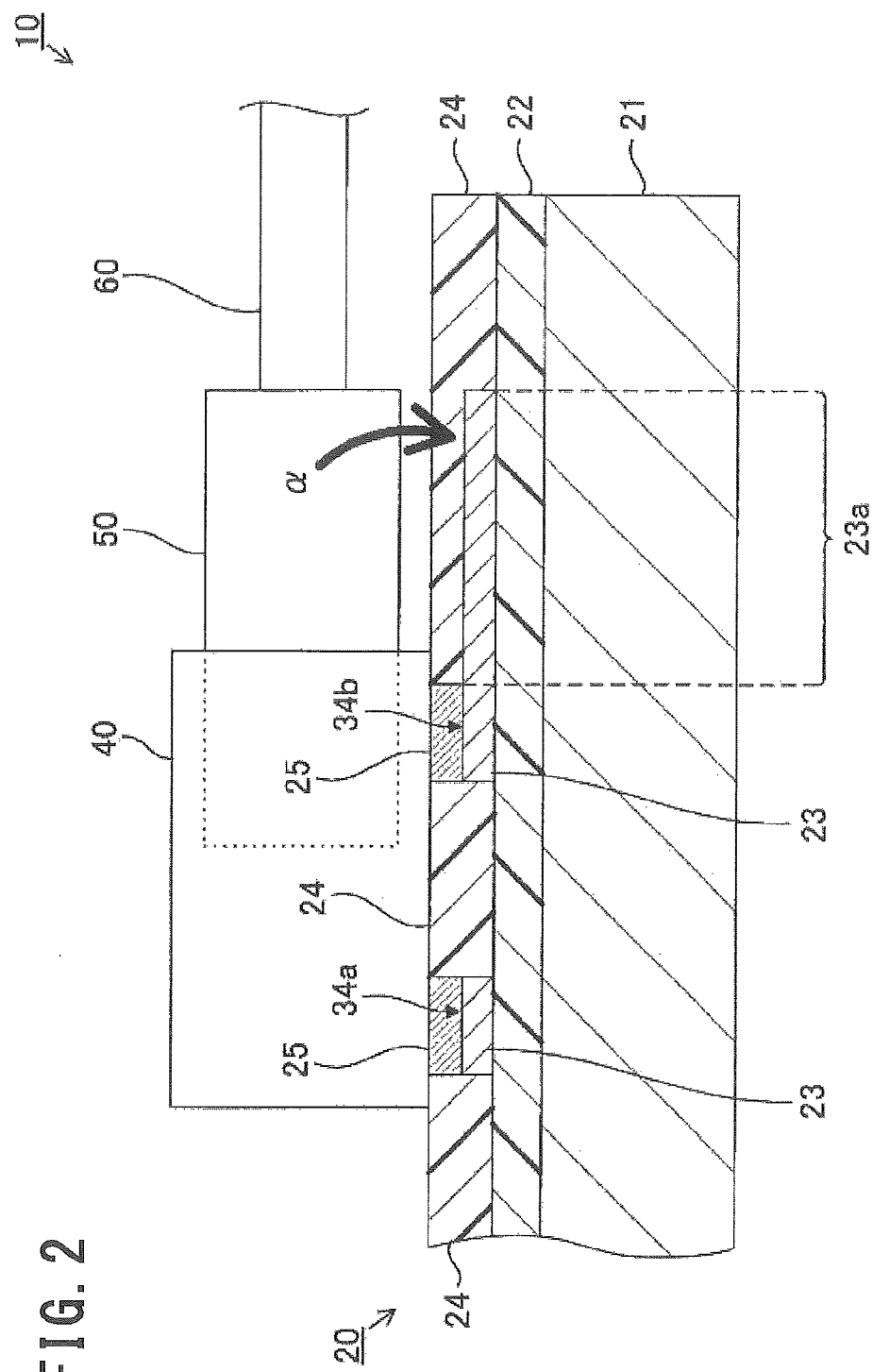
FIG. 2 is a longitudinal sectional view showing a schematic configuration of the LED substrate module 10, taken along an arrow X-X shown in FIG. 1B.

As shown in FIG. 1 and FIG. 2, the LED substrate module 10 of the present embodiment includes a wiring substrate 20 (a conductive board 21, an insulation layer 22, a wiring pattern 23, an extension part 23a, a solder resist layer 24 and a solder layer 25), a light emitting area 30, a sealing frame 31, a sealing body 32, an LED chip 33, an external electrode 34 (land portions 34a, 34b), a fixed connector (receptacle, internal connector, female connector) 40, a detachable connector (plug, external connector, male connector) 50, and a connecting cable 60.

Further, in FIG. 1 and FIG. 2, for the purpose of facilitating understanding, the size, shape and arrangement of the components of the LED substrate module 10 are schematically shown in an exaggerated manner. Further, the size, shape and arrangement of the components are different from the actual.

As shown in FIG. 1, the wiring substrate 20 has a substantially rectangular flat-plate shape and the light emitting area (light emitting part) 30 has a circular flat shape. The light emitting area 30 is provided on a surface of the wiring substrate 20. A surface of the light emitting area 30 is a light emitting surface of the LED substrate module 10.

The sealing frame 31 has a circular frame shape (doughnut shape). On the inside portion surrounded by the sealing frame 31, the sealing body 32 is injected and charged, thereby forming a sealing part (sealing area). The sealing part is the light emitting area 30.

The sealing frame 31 is formed by a synthetic resin material (e.g., silicone resin, epoxy resin, etc.) and the sealing body 32 is formed by a synthetic resin material (e.g., silicone resin, etc.) containing a phosphor.

As shown in FIG. 1, on the light emitting area 30, a plurality of LED (Light Emitting Diode) chips 33 is arranged in a grid-like shape with intervals therebetween. In FIG. 1, only three LED chips 33 are shown.

The LED chips 33 are bare chips and mounted/carried on a surface of the wiring substrate 20 by COB (Chip on Board) method. The LED chips 33 are embedded in the transparent sealing body 32 by being sealed in the sealing body 32.

In other words, the sealing frame 31 is provided on an outer peripheral edge of the light emitting area 30. The sealing frame 31 is formed on the surface of the wiring substrate 20 so as to surround a plurality of LED chips 33.

As shown in FIG. 1A, two external electrodes 34 having the same dimensional shape are arranged in the vicinity of diagonal portions on the surface of the wiring substrate 20 and on the outside (external area) of the sealing frame 31.

Each of the external electrodes 34 is configured by two rectangular land portions 34a, 34b which are arranged in parallel.

Each LED chip 33 constitutes a series-parallel circuit of LEDs (not shown) by being connected to each other via the wiring pattern 23 (see FIG. 2) formed on the surface of the wiring substrate 20. The series-parallel circuit of LEDs is connected to the external electrodes 34 via the wiring pattern 23.

As shown in FIG. 1B, on the surface of the wiring substrate 20, the fixed connector 40 having a substantially rectangular parallelepiped shape is respectively mounted/carried on two external electrodes 34.

A leading end side of the detachable connector 50 having a substantially rectangular parallelepiped shape is inserted and connected to each fixed connector 40.

The connecting cable 60 is connected to a rear end side of each detachable connector 50.

On the surface of the wiring substrate 20, the extension part 23a extended from the wiring pattern 23 is disposed in a portion located immediately below the detachable connector 50.

In a plan view of the wiring substrate 20, the dimension of the extension part 23a is set in a size that is equal to or greater than the dimension of the detachable connector 50.

Therefore, the portion of the wiring substrate 20 that is located immediately below the detachable connector 50 is entirely covered by the extension part 23a.

As shown in FIG. 2, the wiring substrate 20 includes the conductive board 21, the insulation layer 22, the wiring pattern 23, the solder resist layer 24 and the solder layer 25.

The conductive board 21 is formed by a plate of metallic material (e.g., aluminum alloy, pure copper, copper-based alloy, etc.) with high thermal conductivity and low electrical resistance.

The insulation layer 22 is formed by a synthetic resin material (e.g., epoxy resin, etc.), the wiring pattern 23 is formed by a thin-film layer of metallic material (e.g., pure copper, etc.) and the solder resist layer 24 is formed by a synthetic resin layer (e.g., acrylic resin, epoxy resin, etc.).

As shown in FIG. 2, the insulation layer 22 is formed on substantially the entire surface of the conductive board 21 and the wiring pattern 23 is formed on the insulation layer 22.

The solder resist layer 24 is formed on the insulation layer 22 and the wiring pattern 23. The insulation layer 22 and the wiring pattern 23 are covered with the solder resist layer 24.

The surface portion of the wiring pattern 23 exposed from the solder resist layer 24 is each of the land portions 34a, 34b of the external electrodes 34.

Each of the land portions 34a, 34b of the external electrodes 34 and a lower surface of the fixed connector 40 are soldered to each other by the solder layer 25.

As shown in FIG. 2, the extension part 23a of the wiring pattern 23 is integrally connected to the land portion 34b of the external electrode 34 and extended to the portion corresponding to the detachable connector 50.

The solder resist layer 24 is formed on the extension part 23a. The extension part 23a is covered with the solder resist layer 24.

Specifically, of the wiring pattern 23, only respective land portions 34a, 34b are exposed to the surface of the wiring substrate 20 and the extension part 23a is not exposed from the surface of the wiring substrate 20.

When the LED substrate module 10 having the above-described configuration is assembled to the electronic product (not shown), it is possible to facilitate the assembly of the electronic product by connecting the detachable connector 50 to the fixed connector 40 and connecting the connecting cable 60 extended from the detachable connector 50 to other electronic devices (not shown) within the electronic product.

[Operation and Effect of Illustrative Embodiment]

According to the LED substrate module 10 of the present embodiment, the following operation/effect can be obtained.

[1] The wiring substrate 20 includes the wiring pattern 23 formed on the surface of the conductive board 21 via the insulation layer 22 and the extension part 23a extended from the wiring pattern 23.

The extension part 23a of the wiring pattern 23 is disposed at a portion located immediately below the detachable connector 50.

The detachable connector 50 is connected to the fixed connector 40.

The fixed connector 40 is mounted on the wiring substrate 20 and connected and fixed to the wiring pattern 23.

The solder resist layer 24 (covering layer) is adapted to cover the insulation layer 22 and the wiring pattern 23.

Respective land portions 34a, 34b of the external electrode 34 are configured by the portions of the wiring pattern 23 exposed from the solder resist layer 24.

The fixed connector 40 is connected and fixed to respective land portions 34a, 34b.

Accordingly, as shown in FIG. 2, the detachable connector 50 is fixed in a state of being abutted against the extension part 23a of the wiring pattern 23 extended at a position immediately below the detachable connector 50 even when, for some reasons, load is applied to the detachable connector 50 in a direction (direction of an arrow α) of the wiring substrate 20 to cause the detachable connector 50 to be tilted and therefore a portion of the detachable connector 50 peels off and protrudes through the solder resist layer 24. As a result, the detachable connector 50 is not tilted more than that.

Therefore, according to the wiring substrate 20, there is no possibility that a portion of the detachable connector 50 peels off and protrudes through the insulation layer 22 and the detachable connector 50 comes into contact with the surface of the conductive board 21. Accordingly, the insulation failure can be prevented from occurring in the conductive board 21. As a result, it is possible to prevent the short-circuit failure from occurring between the conductive board 21 and respective connectors 40, 50.

Meanwhile, as reasons of applying load to the detachable connector 50, there are some causes that the connecting cable 60 is stretched, the electronic device is vibrated or an operator is brought into contact with the detachable connector 50 when the LED substrate module 10 is mounted on the electronic component, for example.

On the contrary, as shown in FIG. 3, the LED substrate module 100 of the related art is not provided with the extension part 23a of the wiring pattern 23 shown in FIG. 2. Accordingly, there is a possibility that a portion of the detachable connector 50 peels off and protrudes through the solder resist layer 24 and the insulation layer 22 when load is applied to the detachable connector 50 in a direction (direction of the arrow α) of the wiring substrate 20 to cause the detachable connector 50 to be tilted.

As a result, a portion of the detachable connector 50 comes into contact with the surface of the conductive board 21 and therefore the insulation failure occurs in the conductive board 21. Consequently, there is a problem that the short-circuit failure occurs between the conductive board 21 and respective connectors 40, 50.

According to the present embodiment, it is possible to securely solve the above problems in the LED substrate module 100 of the related art.

[2] The wiring substrate 20 includes the solder layer 25 for soldering each of the land portions 34a, 34b of the external electrode 34 and the fixed connector 40.

Therefore, the wiring pattern 23 and the fixed connector 40 can be connected and fixed to each other with low cost.

[3] The wiring substrate 20 includes the light emitting area 30 on which a plurality of LED chips 33 is disposed, and the fixed connector 40 is mounted on the surface of the wiring substrate 20 and on the outside of the light emitting area 30.

With this configuration, radiation of light from the light emitting area 30 is not hindered by each of the connectors 40, 50 and therefore it is possible to provide the LED substrate module 10 with high luminous efficiency.

<Other Embodiments>

The present invention is not limited to each of the embodiments but may be embodied as follows. Even in these cases, it is possible to obtain the operation/effect that is equal to or better than each of the embodiments.

[A] The LED chip 33 may be replaced with any semiconductor light emitting element (e.g., an organic EL chip, etc.).

[B] The solder layer 25 may be replaced with any bonding material layer. For example, the solder layer 25 may be replaced with a conductive resin layer or a layer of metallic particulate bonding material (gold, silver, palladium, copper, etc.).

Further, the electrical connection may be established in such a manner that the solder layer 25 is omitted and the fixed connector 40 and respective land portions 34a, 34b of the external electrode 34 are in direct contact with each other.

In this case, the fixed connector 40 may be connected to the wiring substrate 20 by using any fixing means (e.g., screwing, or the like).

[C] The conductive board 21 is not limited to the metallic material but may be formed by a plate of any conductive material (e.g., conductive synthetic resin, or the like).

[D] The solder resist layer 24 may be omitted.

Further, in the case where the solder layer 25 is omitted or replaced with other bonding material layers, the solder resist layer 24 may be replaced with any covering layer having insulating property.

The present invention is not intended to be limited to the descriptions of each of the aspects and the above-described embodiments. Various modifications in the range that can be easily conceived by those skilled in the art without departing from the description of the claims are also included in the present invention. The contents of the publications disclosed in this specification are incorporated herein by reference in its entirety.

What is claimed is:

1. A wiring substrate comprising:
   a wiring pattern that is formed on a surface of a conductive board via an insulation layer;
   an extension part that is extended from the wiring pattern;
   a covering layer that covers the extension part; and
   a land portion comprises a portion of the wiring pattern and exposed from the covering layer,
   wherein the extension part is disposed in a portion located immediately below a detachable connector,
   the detachable connector is connected to a fixed connector mounted on the wiring substrate and connected and fixed to the wiring pattern, and
   wherein the land portion is arranged adjacent to the extension part.

2. The wiring substrate according to claim 1 further comprising:
   a second land portion comprising a portion of the wiring pattern and exposed from the covering layer, the second land portion begin arranged parallel to the land portion with a gap therebetween,
   wherein the covering layer covers the insulation layer and the wiring pattern, and
   wherein the fixed connector is connected and fixed to the land portion.

3. The wiring substrate according to claim 2 further comprising a solder layer that is used for soldering the land portion and the fixed connector,
   wherein the covering layer comprises a solder resist layer.

4. A substrate module comprising:
   the wiring substrate according to claim 1;
   the fixed connector that is mounted on the wiring substrate; and
   a semiconductor light emitting element that is mounted on the wiring substrate.

5. The substrate module according to claim 4, wherein the wiring substrate includes a light emitting area on which a plurality of semiconductor light emitting elements is disposed, and
the fixed connector is mounted on a surface of the wiring substrate other than the light emitting area.

* * * * *